(12) United States Patent
Choi et al.

(10) Patent No.: US 8,525,215 B2
(45) Date of Patent: Sep. 3, 2013

(54) LIGHT EMITTING DEVICE, METHOD OF MANUFACTURING THE SAME, LIGHT EMITTING DEVICE PACKAGE, AND LIGHTING SYSTEM

(75) Inventors: Kwang Ki Choi, Seoul (KR); Hwan Hee Jeong, Seoul (KR); Ji hyung Moon, Seoul (KR); Sang Youl Lee, Seoul (KR); June O Song, Seoul (KR); Se Yeon Jung, Seoul (KR); Tae-Yeon Seong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 137 days.

(21) Appl. No.: 13/175,424

(22) Filed: Jul. 1, 2011

(65) Prior Publication Data

US 2012/0001196 A1  Jan. 5, 2012

(30) Foreign Application Priority Data

Jul. 5, 2010  (KR) .................. 10-2010-0064559

(51) Int. Cl.
*H01L 33/42* (2010.01)

(52) U.S. Cl.
USPC .. 257/99; 257/76; 257/E33.063; 257/E29.144

(58) Field of Classification Search
None
See application file for complete search history.

(56) References Cited

U.S. PATENT DOCUMENTS

| 7,317,212 B2 * | 1/2008 | Shin ........................... 257/98 |
| 7,989,832 B2 * | 8/2011 | Kim ............................ 257/98 |
| 8,193,548 B2 * | 6/2012 | Tanaka et al. ................ 257/94 |
| 2006/0006407 A1 * | 1/2006 | Kim et al. .................... 257/103 |
| 2007/0080352 A1 * | 4/2007 | Wu et al. ...................... 257/79 |
| 2008/0067497 A1 * | 3/2008 | Kim ............................ 257/13 |
| 2008/0157115 A1 * | 7/2008 | Chuang et al. ............... 257/99 |
| 2009/0179221 A1 * | 7/2009 | Han ............................. 257/103 |
| 2009/0278163 A1 * | 11/2009 | Sakamoto et al. .......... 257/101 |
| 2010/0065868 A1 * | 3/2010 | Kitagawa et al. ............ 257/98 |
| 2010/0102345 A1 * | 4/2010 | Kong et al. ................... 257/98 |
| 2010/0117115 A1 * | 5/2010 | Tanaka et al. ............... 257/103 |

FOREIGN PATENT DOCUMENTS

| JP | 2003-282938 A | 10/2003 |
| KR | 10-0672077 B1 | 1/2007 |
| KR | 10-0801617 B1 | 2/2008 |
| KR | 10-0813598 B1 | 3/2008 |
| KR | 10-0832070 B1 | 5/2008 |

OTHER PUBLICATIONS

Gallium Oxide downloaded from URL <http://www.chemicalbook.com/ChemicalProductProperty_EN_CB0268996.htm> on Dec. 30, 2012.*

Ejder, E. Refractive Index of GaN, Phys. Stat. Sol. (a), 6(455 (1971) pp. 445-448.*

* cited by examiner

*Primary Examiner* — Thomas L Dickey
*Assistant Examiner* — Joseph Schoenholtz
(74) *Attorney, Agent, or Firm* — Birch, Stewart, Kolasch & Birch, LLP

(57) ABSTRACT

Provided are a light emitting device, a method of manufacturing the same, a light emitting device package, and a lighting system. The light emitting device includes: a light emitting structure layer including a first conductive semiconductor layer, an active layer, and a second conductive semiconductor layer; an oxide protrusion disposed on at least a portion of the second conducive semiconductor layer; and a current spreading layer on the second conductive semiconductor layer and the oxide protrusion.

18 Claims, 9 Drawing Sheets

LIGHT EMITTING DEVICE, METHOD OF MANUFACTURING THE SAME, LIGHT EMITTING DEVICE PACKAGE, AND LIGHTING SYSTEM

CROSS-REFERENCE TO RELATED APPLICATIONS

The present application claims priority of Korean Patent Application No. 10-2010-0064559 filed on Jul. 5, 2010, which is hereby incorporated by reference in its entirety.

BACKGROUND

The present disclosure relates to a light emitting device, a method of manufacturing the same, a light emitting device package, and a lighting system.

A Light Emitting Diode (LED) is manufactured by combining a p-n junction diode, which is characterized in converting electric energy into light energy, with Group III and V elements in the periodic table of the chemical elements. The LED may produce various colors by adjusting a composition ratio of a compound semiconductor and materials.

The LED may generate light energy corresponding to an energy gap between a conduction band and a valance band by combining electrons in an n-layer and electron-holes in a p-layer when forward voltage is applied.

Especially, a blue LED, a green LED, and an Ultra Violet (UV) LED using a nitride semiconductor are commercialized and are extensively used.

SUMMARY

Embodiments provide a light emitting device having a new structure, a method of manufacturing the same, a light emitting device package, and a lighting system.

Embodiments also provide a light emitting device having an improved light efficiency, a method of manufacturing the same, a light emitting device package, and a lighting system.

Embodiments also provide a light emitting device having an improved current injection characteristic, a method of manufacturing the same, a light emitting device package, and a lighting system.

Embodiments also provide a light emitting device manufactured with simple processes, a method of manufacturing the same, a light emitting device package, and a lighting system.

In one embodiment, a light emitting device includes: a light emitting structure layer including a first conductive semiconductor layer, an active layer, and a second conductive semiconductor layer; an oxide protrusion disposed on at least a portion of the second conducive semiconductor layer; and a current spreading layer on the second conductive semiconductor layer and the oxide protrusion.

In another embodiment, a light emitting device package includes: a body; a first electrode layer and a second electrode layer on the body; a light emitting device connected electrically to the first electrode layer and the second electrode layer on the body; and a molding member surrounding the light emitting device, wherein the light emitting device including: a light emitting structure layer including a first conductive semiconductor layer, an active layer, and a second conductive semiconductor layer; an oxide protrusion disposed on at least a portion of the second conducive semiconductor layer; and a current spreading layer on the second conductive semiconductor layer and the oxide protrusion.

The details of one or more embodiments are set forth in the accompanying drawings and the description below. Other features will be apparent from the description and drawings, and from the claims.

DETAILED DESCRIPTION OF THE EMBODIMENTS

In the descriptions of embodiments, it will be understood that when a layer (or film), a region, a pattern, or a structure is referred to as being 'on/above/over/upper' substrate, each layer (or film), a region, a pad, or patterns, it can be directly on substrate each layer (or film), the region, the pad, or the patterns, or intervening layers may also be present. Further, it will be understood that when a layer is referred to as being 'under/below/lower' each layer (film), the region, the pattern, or the structure, it can be directly under another layer (film), another region, another pad, or another patterns, or one or more intervening layers may also be present.

In the drawings, the thickness or size of each layer is exaggerated, omitted, or schematically illustrated for convenience in description and clarity. Also, the size of each element does not entirely reflect an actual size.

Hereinafter, a light emitting device, a method of manufacturing the same, a light emitting device package, and a lighting system according to embodiments will be described in more detail with reference to the accompanying drawings.

Figure 1:
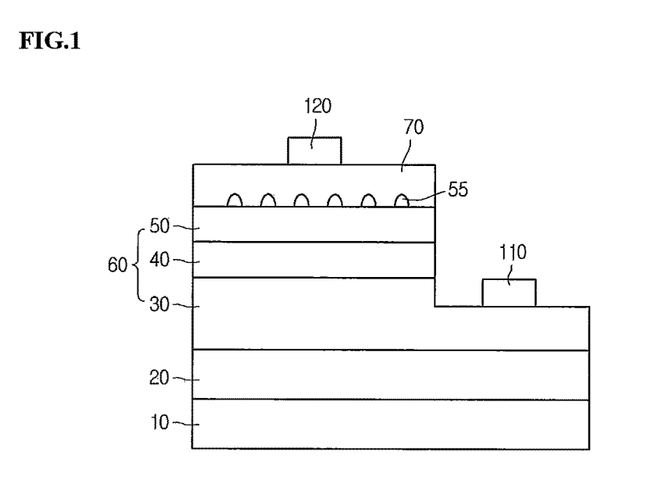
FIG. 1 is a view of a light emitting device according to a first embodiment.

FIG. 1 is a view of a light emitting device according to a first embodiment.

Referring to FIG. 1, the light emitting device includes an undoped nitride layer 20 on a substrate 10, a light emitting structure layer 60 (including a first conductive semiconductor layer 30, an active layer 40, and a second conductive semiconductor layer 50, on the undoped nitride layer 20), an oxide protrusion 55 on the second conductive semiconductor layer 50, a current spreading layer 70, a first electrode 110 on the first conductive semiconductor 30, and a second electrode 120 on the current spreading layer 70.

The substrate 10 may be formed of at least one of a light transmitting material such as $Al_2O_3$, a single crystal substrate, SiC, GaAs, GaN, ZnO, AlN, Si, GaP, and InP, but is not limited thereto.

The substrate 10 may have an inclined top surface or a plurality of protruding patterns thereon to smoothly grow the light emitting structure layer 60 and improve light extraction efficiency of the light emitting device. For example, the protruding pattern may have one of a hemispherical shape, a polygonal shape, a triangular pyramid shape, and a nano pillar shape.

The undoped nitride layer 20 may be disposed on the substrate 10 and formed of an undoped GaN-based semiconductor layer.

The undoped nitride layer 20 is not doped with a dopant so that it has a significantly lower electrical conductivity than the first conductive semiconductor layer 30. Also, the undoped nitride layer 20 grows to improve the crystallinity of the first conductive semiconductor layer 30. Additionally, a buffer (not shown) may be disposed between the substrate 10 and the undoped nitride layer 20 to alleviate a lattice constant difference.

The light emitting structure layer 60 may be formed of a Group III to V compound semiconductor such as an AlInGaN, GaAs, GaAsP, or GaP based compound semiconductor material. Electrons and electron-holes from the first and second conductive semiconductor layers 30 and 50 are combined in the active layer 40 to emit light.

The first conductive semiconductor layer 30 may include an n type semiconductor layer. The n type semiconductor layer may be formed of one of semiconductor materials having a chemical formula of $In_xAl_yGa_{1-x-y}N$ ($0 \leq x \leq 1$, $0 \leq y \leq 1$, $0 \leq x+y \leq 1$) such as InAlGaN, GaN, AlGaN, AlInN, InGaN, AlN, and InN, and an n-type dopant such as Si, Ge, and Sn may be doped into the n-type semiconductor layer.

The first conductive semiconductor layer 30 may be formed by injecting TMGa gas, $NH_3$ gas, or $SiH_4$ gas with hydrogen gas into a chamber. Additionally, the first conductive semiconductor layer 30 may include a single layer or a multi layer.

The active layer 40 may be disposed on the first conductive semiconductor layer 30. The active layer 40 is a layer emitting light by a bandgap difference of energy bands according to a formation material of the active layer 40 when electrons (or electron-holes) injected through the first conductive semiconductor layer 30 and electron-holes (or electrons) injected through the second conductive semiconductor layer 50 are combined.

The active layer 40 may have one of a single quantum well, a Multi Quantum Well (MQW) structure, a quantum dot structure, and a quantum wire structure, but is not limited thereto.

The active layer 40 may be formed of a semiconductor material having a chemical formula of $In_xAl_yGa_{1-x-y}N$ ($0 \leq x \leq 1$, $0 \leq y \leq 1$, $0 \leq x+y \leq 1$). If the active layer 40 has the MQW structure, the a plurality of well layers and a plurality of barrier layers are stacked to from the active layer 40 and may be formed with a period of a InGaN well layer/a GaN barrier layer.

The active layer 40 may be formed by injecting TMGa gas, TMIn gas, or $NH_3$ gas with hydrogen gas into a chamber.

A clad layer (not shown) doped with an n-type or p-type dopant may be formed on and/or below the active layer 40. Additionally, the clad layer (not shown) may be realized with an AlGaN layer or an InAlGaN layer.

The second conductive semiconductor layer 50 may be formed on the active layer 40. The second conductive semiconductor layer 50 may be realized with a p-type semiconductor layer. The p-type semiconductor layer may be formed of a semiconductor material having a chemical formula of $In_xAl_yGa_{1-x-y}N$ ($0 \leq x \leq 1$, $0 \leq y \leq 1$, $0 \leq x+y \leq 1$), for example, InAlGaN, GaN, AlGaN, InGaN, AlInN, AlN, and InN, and may be doped with a p-type dopant such as Mg, Zn, Ca, Sr, and Ba.

The second conductive semiconductor layer 50 may be formed by injecting TMGa gas, $NH_3$ gas, or $(EtCp_2Mg)$ {Mg $(C_2H_5C_5H_4)_2$} gas with oxygen gas into a chamber. Additionally, the second conductive semiconductor layer 50 may include a single layer or a multi layer.

Meanwhile, unlike the above mentioned, the first conductive semiconductor layer 30 may include a p-type semiconductor layer and the second conductive semiconductor layer 50 may include an n-type semiconductor layer. Additionally, a third conductive semiconductor layer (not shown) including an n-type or p-type semiconductor layer may be disposed on the second conductive semiconductor layer 50. Accordingly, the light emitting device may have at least one of np, pn, npn, and pnp junction structures. Additionally, a doping concentration of a conductive dopant in the first conductive semiconductor layer 30 and the second conductive semiconductor layer 50 may be uniform or uneven. That is, the light emitting structure layer 60 may have various structures, but is not limited thereto.

The oxide protrusion 55 is formed of an oxide in the second conductive semiconductor layer 50 and has a protruding shape obtained when the second conductive semiconductor layer 50 is oxidized. The oxide protrusion 55 has an upper surface bulging upward and has a fine nano size.

The current spreading layer 70 may include a transparent electrode layer formed of a transparent conductive oxide such as Indium-Tin Oxide (ITO), ZnO, Aluminum doped Zinc Oxide (AZO), Indium Zinc Oxide (IZO), Antimony Tin Oxide (ATO), and Zinc Indium-Tin Oxide (ZITO).

In relation to the light emitting device according to an embodiment, the oxide protrusion 55 is formed between the second conductive semiconductor layer 50 and the current spreading layer 70. The oxide protrusion 55 is formed by partially oxidizing the second conductive semiconductor layer 50, so that an oxide target for depositing an additional oxide is not required. As a result of this, a manufacturing process becomes simpler.

Additionally, the oxide protrusion 55 allows light to be irregularly reflected at the interface between the second conductive semiconductor layer 50 and the current spreading layer 70, thereby increasing an amount of light extracted to the external of the light emitting device to improve light efficiency.

Additionally, the oxide protrusion 55 locally lowers the height of a Schottky barrier at the interface between the second conductive semiconductor layer 50 and the current spreading layer 70, thereby improving current injection characteristics. Thus, electrical characteristics of the light emitting device can be improved.

Figure 2:
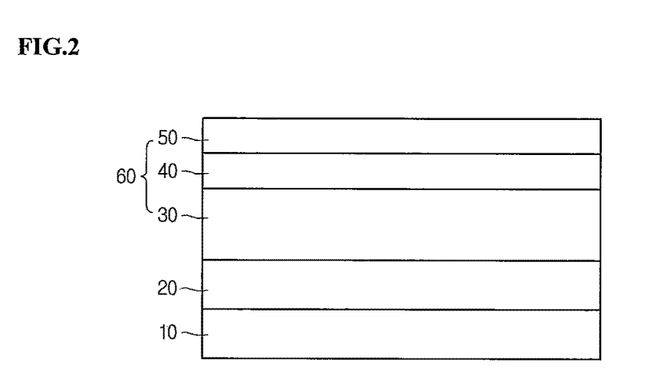
FIGS. 2 and 3 are views illustrating a method of manufacturing the light emitting device according to the first embodiment.
Figure 3:
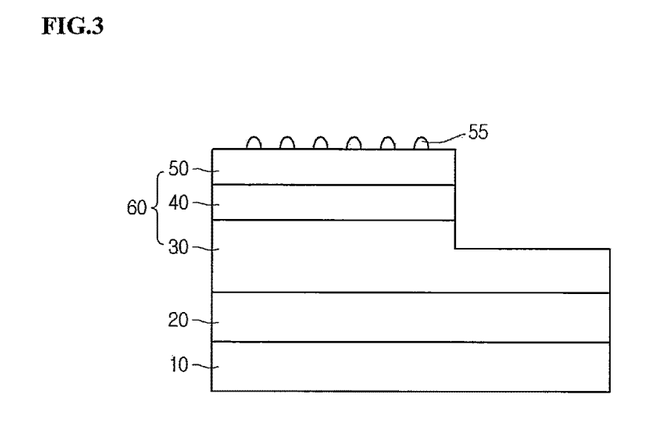

FIGS. 2 and 3 are views illustrating a method of manufacturing the light emitting device according to the first embodiment.

Referring to FIG. 2, a substrate 10 is prepared and an undoped nitride layer 20 is formed on the substrate 10.

Then, a light emitting structure layer 60 including a first conductive semiconductor layer 30, an active layer 40, and a second conductive semiconductor layer 50 is formed on the undoped nitride layer 20.

Referring to FIG. 3, the first conductive semiconductor layer 30 is partially exposed toward an upper direction through a mesa etching process for selectively removing the light emitting structure layer 60.

The mesa etching process may include a dry etching method such as Inductively Coupled Plasma (ICP), but is not limited thereto.

Then, an oxide protrusion 55 is formed on the second conductive semiconductor layer 50. A method of forming the oxide protrusion will be described later.

Then, as shown in FIG. 1, the current spreading layer 70 is formed on the second conductive semiconductor layer 60 and the oxide protrusion 55. The first electrode 110 is formed on the first conductive semiconductor layer 30. The second electrode 120 is formed on the current spreading layer 70.

At this point, the current spreading layer 70 may be formed through deposition processes such as e-beam deposition, sputtering, and Plasma Enhanced Chemical Vapor deposition (PECVD), but is not limited thereto.

The first and second electrodes 110 and 120 may be formed through a deposition process or a plating process, but is not limited thereto.

Thus, the light emitting device according to the first embodiment may be manufactured through the above processes.

Figure 4:
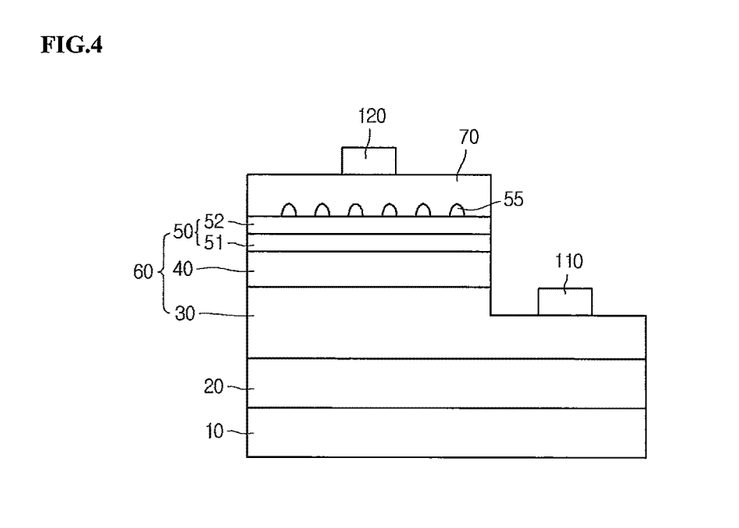
FIG. 4 is a view illustrating a light emitting device according to another example of the first embodiment.

FIG. 4 is a view illustrating a light emitting device according to another example of the first embodiment.

While the example of FIG. 4 is described, overlapping description with respect to FIG. 1 will be omitted.

Referring to FIG. 4, a second conductive semiconductor layer 50 includes a first semiconductor layer 51 and a second semiconductor layer 52. The first and second semiconductor layers 51 and 52 may be formed of semiconductor layers having respectively different compositions. The first semiconductor layer 51 contacts the active layer 40 and the second semiconductor layer 52 is disposed on the first semiconductor layer 51. The oxide protrusion 55 may have a protruding shape obtained when the second semiconductor layer 52 is oxidized. Additionally, the second semiconductor layer 52 may be formed of a material having a different conductive type than the first semiconductor layer 51 and may be formed of the above-mentioned third conductive semiconductor layer.

Figure 5:
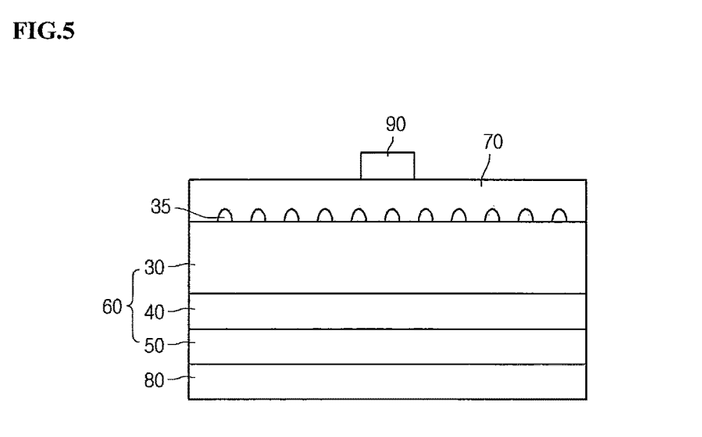
FIG. 5 is a view illustrating a light emitting device according to a second embodiment.

FIG. 5 is a view illustrating a light emitting device according to a second embodiment.

While the light emitting device according to the second embodiment is described, overlapping description with respect to the first embodiment will be omitted.

Referring to FIG. 5, the light emitting device according to the second embodiment includes a light emitting structure layer 60 (including a first conductive semiconductor layer 30, an active layer 40, and a second conductive semiconductor layer 50 on a conductive supporting substrate 80), an oxide protrusion 35 on the first conductive semiconductor layer 30, a current spreading layer 70 on the first conductive semiconductor layer 30 and the oxide protrusion 35, and an electrode 90 on the current spreading layer 70.

The conductive supporting substrate 80 may include at least one of Ti, Cr, Ni, Al, Pt, Au, W, Cu, Mo, and a carrier wafer (for example, including Si, Ge, GaAs, ZnO, SiC, SiGe, or GaN).

Although not shown in the drawings, a reflective layer (not shown) is formed on the conductive supporting substrate 80 and an ohmic contact layer (not shown) may be further formed on the reflective layer.

The reflective layer (not shown) upwardly reflects incident light from the light emitting structure layer 60 to improve light extraction efficiency. The reflective layer may be formed of at least one of Ag, Al, Pt, Pd, Cu and Cu with high reflectivity. Additionally, the reflective layer may include a multi layer using the metal or an alloy and may be formed of a transparent conductive material such as IZO, IZTO, IAZO, IGZO, IGTO, and AZO. That is, the reflective layer may include a stacked layer such as IZO/Ni, AZO/Ag, IZO/Ag/Ni, and AZO/Ag/Ni.

The ohmic contact layer (not shown) ohmic-contacts the second conductive semiconductor layer 50 of the light emitting structure layer 60 and serves to smoothly provide power to the light emitting structure layer 60. The ohmic contact layer may be formed of at least one of ITO, In—ZnO (IZO), Ga—ZnO (GZO), Al—ZnO (AZO), Al—Ga ZnO (AGZO), In—Ga ZnO (IGZO), IrOx, RuOx, RuOx/ITO, Ni/IrOx/Au and Ni/IrOx/Au/ITO, but is not limited thereto.

The light emitting structure layer 60 may be formed of Group III to V compound semiconductors. For example, the light emitting structure layer 60 may include a second conductive semiconductor layer 50, an active layer 40 on the second conductive semiconductor layer 50, and a first conductive semiconductor layer 30 on the active layer 40.

The second conductive semiconductor layer 50 may be realized with a p-type semiconductor layer. The p-type semiconductor layer may be formed of a semiconductor material having a chemical formula of $In_xAl_yGa_{1-x-y}N$ ($0 \leq x \leq 1$, $0 \leq y \leq 1$, $0 \leq x+y \leq 1$), for example, InAlGaN, GaN, AlGaN, InGaN, AlInN, AlN, and InN, and may be doped with a p-type dopant such as Mg, Zn, Ca, Sr, and Ba.

The second conductive semiconductor layer 50 may be formed by injecting TMGa gas, $NH_3$ gas, or $(EtCp_2Mg)\{Mg(C_2H_5C_5H_4)_2\}$ gas with oxygen gas into a chamber.

The active layer 40 may be disposed on the second conductive semiconductor layer 50. The active layer 40 is a layer emitting light by a bandgap difference of energy bands according to a formation material of the active layer 40 when electrons (or electron-holes) injected through the first conductive semiconductor layer 30 and electron-holes (or electrons) injected through the second conductive semiconductor layer 50 are combined.

The active layer 40 may have one of a single quantum well, a MQW structure, a quantum dot structure, and a quantum wire structure, but is not limited thereto.

The active layer 40 may be formed of a semiconductor material having a chemical formula of $In_xAl_yGa_{1-x-y}N$ ($0 \leq x \leq 1$, $0 \leq y \leq 1$, $0 \leq x+y \leq 1$). If the active layer 40 has the MQW structure, the a plurality of well layers and a plurality of barrier layers are stacked to from the active layer 40 and may be formed with a period of a InGaN well layer/a GaN barrier layer.

The active layer 40 may be formed by injecting TMGa gas, TMIn gas, or $NH_3$ gas with hydrogen gas into a chamber.

A clad layer (not shown) doped with an n-type or p-type dopant may be formed on and/or below the active layer 40. Additionally, the clad layer (not shown) may be realized with an AlGaN layer or an InAlGaN layer.

The first conductive semiconductor layer 30 may be formed on the active layer 40.

The first conductive semiconductor layer 30 may include an n type semiconductor layer. The n type semiconductor layer may be formed of one of semiconductor materials having a chemical formula of $In_xAl_yGa_{1-x-y}N$ ($0 \leq x \leq 1$, $0 \leq y \leq 1$, $0 \leq x+y \leq 1$) such as InAlGaN, GaN, AlGaN, AlInN, InGaN, AlN, and InN, and an n-type dopant such as Si, Ge, and Sn may be doped into the n-type semiconductor layer.

The first conductive semiconductor layer 30 may be formed by injecting TMGa gas, $NH_3$ gas, or $SiH_4$ gas with hydrogen gas into a chamber. Additionally, the first conductive semiconductor layer 30 may include a single layer or a multi layer.

The oxide protrusion 35 is formed of an oxide in the first conductive semiconductor layer 30 and has a protruding shape obtained when the first conductive semiconductor layer 30 is oxidized. The oxide protrusion 35 has an upper surface bulging upward and has a fine nano size.

The current spreading layer 70 may include a transparent electrode layer formed of a transparent conductive oxide such as Indium-Tin Oxide (ITO), ZnO, Aluminum doped Zinc Oxide (AZO), Indium Zinc Oxide (IZO), Antimony Tin Oxide (ATO), and Zinc Indium-Tin Oxide (ZITO).

Figure 6:
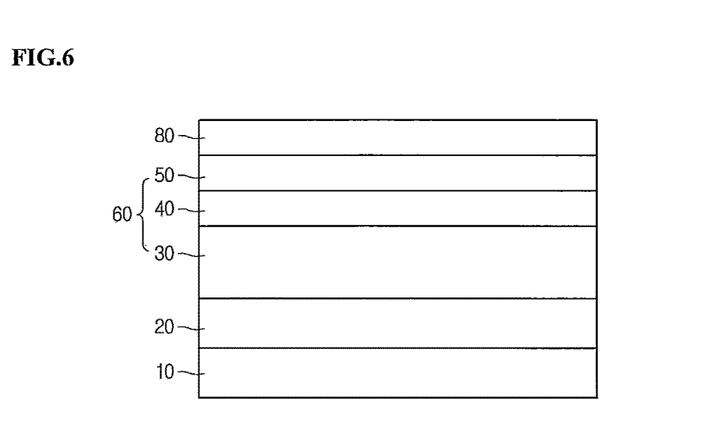
FIGS. 6 to 8 are views illustrating a method of manufacturing the light emitting device according to the second embodiment.
Figure 7:
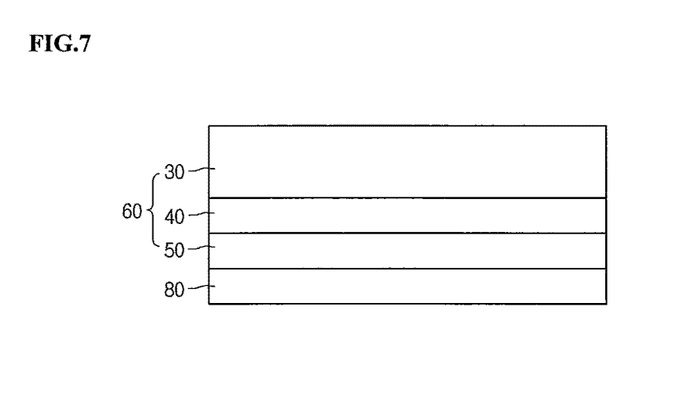
Figure 8:
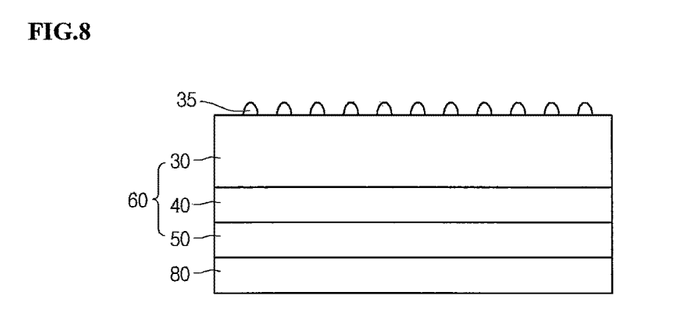

FIGS. 6 to 8 are views illustrating a method of manufacturing the light emitting device according to the second embodiment.

Referring to FIG. 6, a growth substrate 10 is prepared and the undoped nitride layer 20 is formed on the growth substrate 10. Then, a light emitting structure layer 60 including a first conductive semiconductor layer 30, an active layer 40, and a second conductive semiconductor layer 50 is formed on the undoped nitride layer 20.

The growth substrate 10 may be formed of at least one of an $Al_2O_3$ single crystal substrate, SiC, GaAs, GaN, ZnO, Si GaP, InP, Ge, and AlN, but is not limited thereto.

The undoped nitride layer 20 and the light emitting structure layer 60 may be formed on the growth substrate 10 through at least one of Metal Organic Chemical Vapor Deposition (MOCVD), Chemical Vapor Deposition (CVD), Plasma-Enhanced Chemical Vapor Deposition (PECVD), Molecular Beam Epitaxy (MBE) and Hydride Vapor Phase Epitaxy (HVPE), but is not limited thereto.

Then, the conductive supporting substrate 80 is formed on the second conductive semiconductor layer 50. Then, at least one of a reflective layer (not shown) and an ohmic contact layer (not shown) may be further formed on the conductive supporting substrate 80.

The reflective layer and the ohmic contact layer may be formed through at least one of e-beam deposition, sputtering, and PECVD.

The conductive supporting substrate 80 may be formed through a deposition or plating method, or may be formed with an additional sheet through a bonding method. When the conductive supporting substrate 80 is formed through a bonding method, an adhesive layer (not shown) may be further formed between the conductive supporting substrate 80 and the reflective layer.

Referring to FIG. 7, the growth substrate 10 and the undoped nitride layer 20 are removed through a laser lift off or chemical lift off method.

Additionally, a surface defective layer may occur in the exposed first conductive semiconductor layer 30 after the growth substrate 10 and the undoped nitride layer 20 are removed. This surface defective layer may be removed through a wet or dry etching method.

Referring to FIG. 8, the oxide protrusion 35 is formed on the first conductive semiconductor layer 30. A method of forming the oxide protrusion 35 will be described layer.

Then, as shown in FIG. 5, the current spreading layer 70 is formed on the first conductive semiconductor layer 30 and the oxide protrusion 35. An electrode 90 is formed on the current spreading layer 70. Accordingly, the light emitting device according to the second embodiment can be manufactured.

Figure 9:
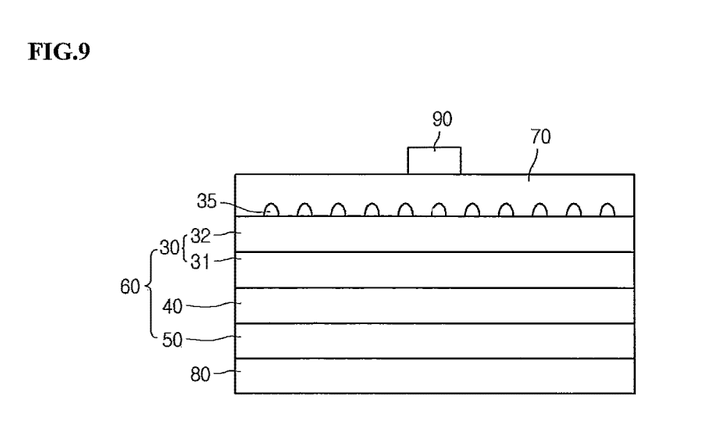
FIG. 9 is a view illustrating a light emitting device according to another example of the second embodiment.

FIG. 9 is a view illustrating a light emitting device according to another example of the second embodiment.

When another embodiment of FIG. 9 is described, overlapping description with respect to FIG. 5 will be omitted.

Referring to FIG. 9, a first conductive semiconductor layer 30 includes a first semiconductor layer 31 and a second semiconductor layer 32. The first and second semiconductor layer 31 and 32 may be formed of semiconductor layers having respectively different compositions. The first semiconductor layer 31 contacts the active layer 40 and the second semiconductor layer 32 is disposed on the first semiconductor layer 31. The oxide protrusion 35 may have a protruding shape obtained when the second semiconductor layer 32 is oxidized.

FIGS. 10 to 15 are views illustrating a method of forming an oxide protrusion while a light emitting device is manufactured according to an embodiment.

Figure 10:
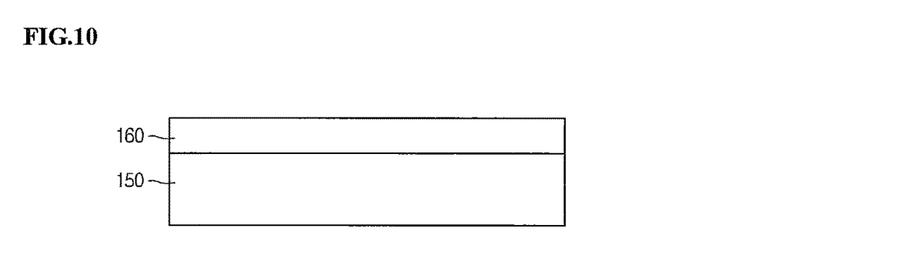
FIGS. 10 to 15 are views illustrating a method of forming an oxide protrusion while a light emitting device is manufactured according to an embodiment.

Referring to FIG. 10, a nitride layer 150 is prepared, and then an Al layer 160 is formed on the nitride layer 150. The nitride layer 150 may be the first conductive semiconductor layer or the second conductive semiconductor layer 50 described above.

Figure 11:
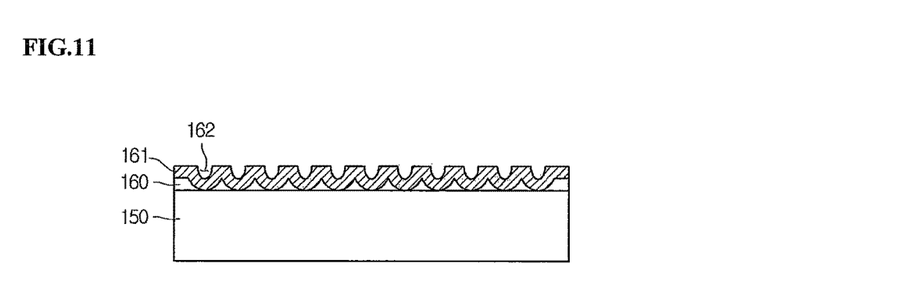

Referring to FIG. 11, an anodic oxidation process is performed on the Al layer 160 to form an anodic alumina oxide layer 161. A pore 162 is formed on the anodic alumina oxide layer 161.

Figure 12:
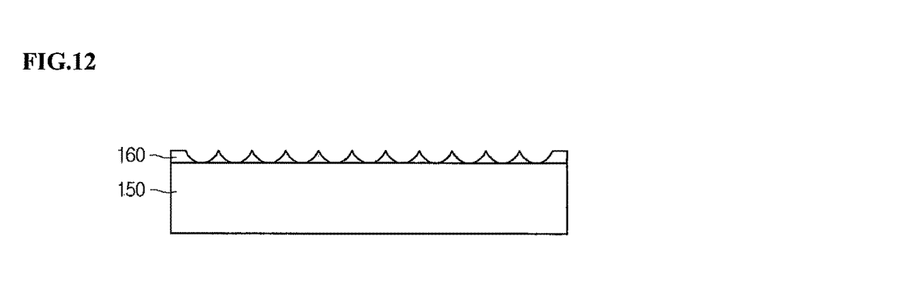

Referring to FIG. 12, the anodic alumina oxide layer 161 is removed through etching. For example, the anodic alumina oxide layer 161 is removed using one of sulphuric acid, chrommic acid, phosphoric acid, and oxalic acid. At this point, the nitride layer 150 below the anodic alumina oxide layer 161 may be partially exposed below the pore 162.

Figure 13:
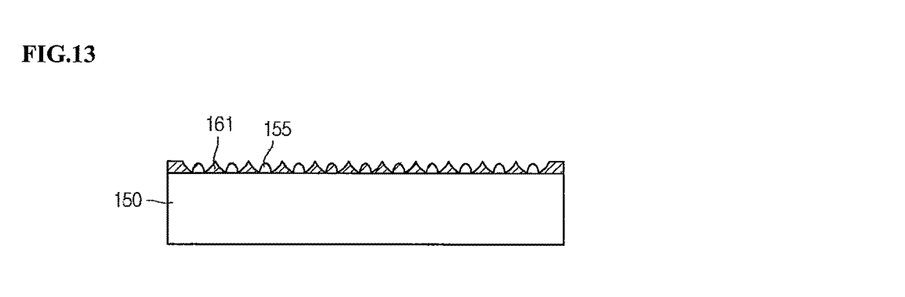

Referring to FIG. 13, an anodic oxidation process is performed on the Al layer 160 again to form an anodic alumina oxide layer 161. At this point, as the Al layer 160 and the nitride layer 150 are oxidized simultaneously, a portion of the nitride layer 150 increases its volume during an oxidation process and protrudes to form the oxide protrusion 155.

Figure 14:
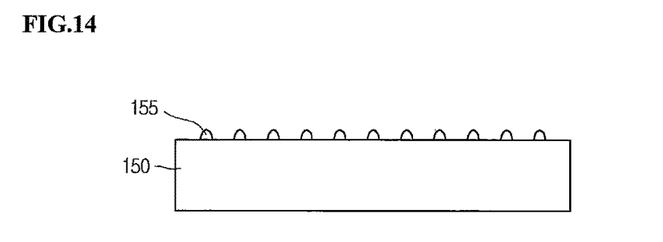
Figure 15:
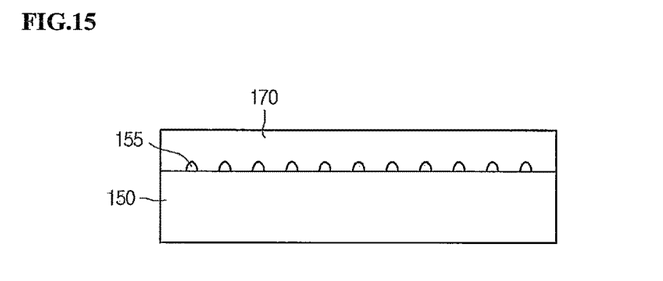

Referring to FIGS. 14 and 15, when the anodic alumina oxide layer 161 is removed through etching, the oxide protrusion 155, which is obtained when the nitride layer 150 is oxidized, remains on the nitride layer 150, and a current spreading layer 170 is formed on the nitride layer 150 and the oxide protrusion 155.

Since the method of forming an oxide protrusion uses an anodic oxidation process to oxidize the nitride layer 150, an additional oxide target is not required and the oxide protrusion 155 having a uniform and constant size is formed.

The nitride layer 150 may be formed of a GaN layer. In this case, the oxide protrusion 155 may be formed of Ga—O.

Additionally, the nitride layer 150 may be formed of one of InN, InGaN, AlInN, AlGaN, AlN, and AlInGaN. In this case, the oxide protrusion 155 may be formed of InO, InGaO, AlInO, AlGaO, AlO, or AlInGaO.

Figure 17:
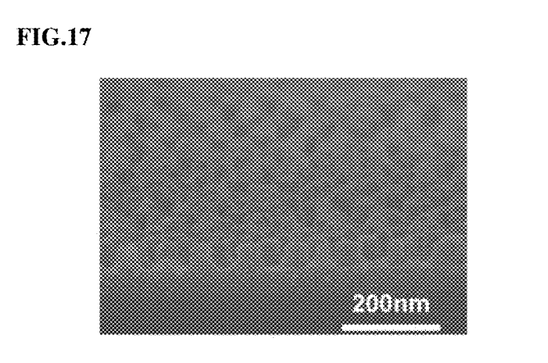
FIG. 17 is a view of an oxide protrusion formed using an anodic oxidation process.

FIG. 17 is a view of an oxide protrusion formed using an anodic oxidation process. As shown in FIG. 17, the oxide protrusion has a uniform size and is arranged with a constant interval.

Figure 16:
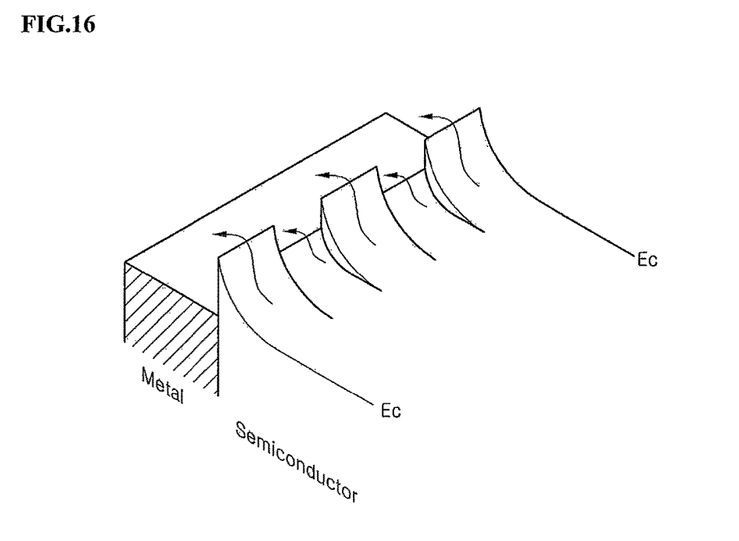
FIG. 16 is a view illustrating how to improve current injection characteristics by locally lowering the height of a Schottky barrier with an oxide protrusion disposed between a nitride layer and a current spreading layer.

FIG. 16 is a view illustrating how to improve current injection characteristics by locally lowering the height of a Schottky barrier with an oxide protrusion disposed between a nitride layer and a current spreading layer.

As shown in FIG. 16, the Schottky barrier is formed between a semiconductor layer corresponding to the nitride layer 150 and a metal layer corresponding to the current spreading layer 170. The oxide protrusion 155 locally lowers the height of the Schottky barrier. Accordingly, an energy bandgap lowering phenomenon occurs in a portion where the oxide protrusion 155 is formed and an entire energy bandgap is reduced.

That is, when the oxide protrusion 155 having another work function is inserted, a uniform energy band structure is divided into two unevenly. At this point, contact resistance is lowered for two reasons. First, the oxide protrusion 155 with another work function is inserted to lower the height of an entire Schottky barrier by a height difference of the Schottky barriers between the oxide protrusion 155/the nitride layer 150 and the current spreading layer 170/the nitride layer 150. Secondly, once the oxide protrusion 155 is inserted, a great potential occurs around it. Therefore, a potential difference occurs overall due to the insertion of the oxide protrusion 155. This lowers the height of the Schottky barrier ultimately.

Figure 18:
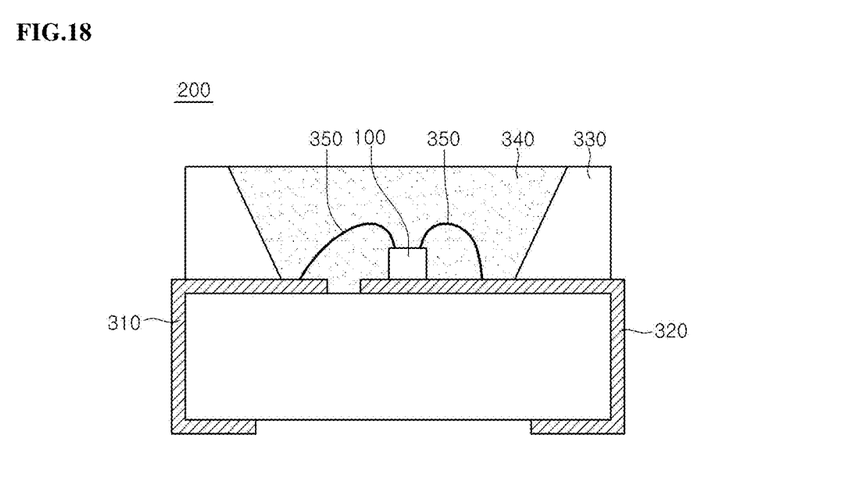
FIG. 18 is a sectional view of a light emitting device package including a light emitting device according to embodiments.

FIG. 18 is a sectional view of a light emitting device package including a light emitting device according to embodiments.

Referring to FIG. 18, the light emitting device package 200 includes a body 330, a first conductive layer 310 and a second conductive layer 320 installed at the body 330, the light emitting device 100 installed at the body and receiving power from the first conductive layer 310 and the second conductive layer 320 according to the first embodiment or the second embodiment, and a molding member 340 surrounding the light emitting device 100.

The body 330 may be formed of silicon material, synthetic resin or metal material, and may have an inclined surface around the light emitting device 100.

The first conductive layer 310 and the second conducive layer 320 are electrically insulated from each other and provide power to the light emitting device 100.

Additionally, the first and second conductive layers 310 and 320 reflect light from the light emitting device 100 to increase light efficiency and may serve to discharge heat from the light emitting device 100.

The light emitting device 100 may be installed on one of the first conductive layer 310, the second conductive layer 320, and the body 330 and may be electrically connected to the first and second conductive layers 310 and 320 through a wire method, a die bonding method, or a flip chip method, but is not limited thereto.

In this embodiment, the light emitting device 100 according to the first embodiment is shown and is electrically connected to the first and second conductive layers 310 and 320 through two wires 350. However, the light emitting device 100 according to the second embodiment may be electrically connected to the first and second conductive layers 310 and 320 through one wire 350. Additionally, when the light emitting device 100 according to the first embodiment is mounted through a flip chip method, it may be electrically connected to the first and second conductive layers 310 and 320 without the wire 350.

The molding member 340 may protect the light emitting device 100 by surrounding it. Additionally, the molding member 340 may include a fluorescent substance to change a wavelength of light emitted from the light emitting device 100.

Additionally, the light emitting device package 200 may include a Chip On Board (COB) type, the body 330 may have a flat top surface, and a plurality of light emitting devices 100 may be installed at the body 330.

A plurality of the light emitting device packages 200 may be arranged on a substrate and an optical member such as a light guide plate, a prism sheet, a diffusion sheet, or a fluorescent sheet may be disposed on a path of light emitted from the light emitting device package 200. This light emitting device package 200, the substrates, and the optical member may serve as a backlight unit. According to another embodiment, the light emitting device 100 or the light emitting device package 200 may be used to realize a lighting unit such as a display device, a guiding device, a lamp, and a street lamp.

Figure 19:
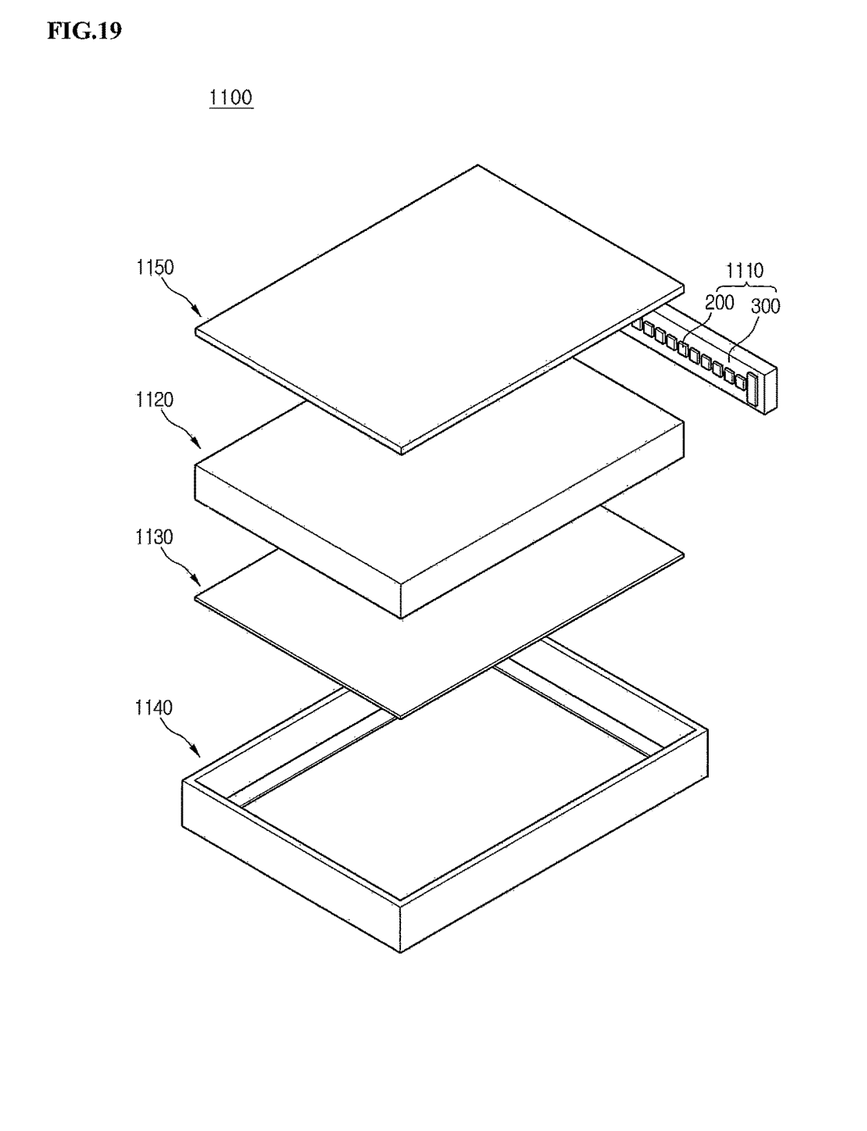
FIG. 19 is a view illustrating a backlight unit including a light emitting device or a light emitting device package according to an embodiment.

FIG. 19 is a view illustrating a backlight unit including a light emitting device or a light emitting device package according to an embodiment. However, the backlight unit 1100 of FIG. 19 is just an example of a lighting system, and thus is not limited thereto.

Referring to FIG. 19, the backlight unit 1100 includes a bottom cover 1140, a light guide member 1120 in the bottom cover 1140, and a light emitting module 1110 disposed at least one side or bottom surface of the light guide member 1120. Additionally, a reflective sheet 1130 may be disposed below the light guide member 1120.

The bottom cover 1140 may have a top surface opened to receive the light guide member 1120, the light emitting module 1110, and the reflective sheet 1130, and may be formed of a metal material or a resin material, but is not limited thereto.

The light emitting module 1110 may include a substrate 300 and a plurality of light emitting devices or a light emitting device package 200 according to an embodiment. The plurality of light emitting devices 100 or the light emitting device package 200 may provide light to the light guide member 1120. However, the light emitting device package 200 is exemplarily installed on the substrate 300 in FIG. 19.

As shown in FIG. 19, the light emitting module 1110 may be disposed on at least one of the inner sides of the bottom cover 1140 and according to this, light may be provided to at least one side of the light guide member 1120.

However, the light emitting module 1110 may be disposed below the bottom cover 1140, thereby providing light toward the bottom surface of the light guide member 1120. The light emitting module 1110 may vary according to a design of the backlight unit 1110, and thus is not limited thereto.

The light guide member 1120 may be disposed in the bottom cover 1140. The light guide member 1120 may allow light provided from the light emitting module 1110 to be a surface light source and then may guide the light to a display panel (not shown).

The light guide member 1120 may be a Light Guide Panel (LGP). The LGP may be formed of one of an acrylic resin series such as polymethyl metaacrylate (PMMA), a polyethylene terephthlate (PET) resin, a poly carbonate (PC) resin, a COC resin, and a polyethylene naphthalate (PEN) resin.

An optical sheet 1150 may be disposed on the light guide member 1120.

The optical sheet 1150 may include at least one of a diffusion sheet, a light condensing sheet, a brightness enhancing sheet, and a fluorescent sheet. For example, the optical sheet 1150 may be formed by sequentially stacking the diffusion sheet, the light condensing sheet, the brightness enhancing sheet, and the fluorescent sheet. In this case, the diffusion sheet 1150 diffuses the light from the light emitting module 1110 uniformly. The diffused light may be condensed on a display panel (not shown) by the light condensing sheet. At this point, the light from the light condensing sheet is randomly polarized and the brightness enhancing sheet may increase the degree of polarization of light from the light condensing sheet. The light condensing sheet may be a dual brightness enhancement film. Additionally, the fluorescent sheet may be a transparent plate or a film with a fluorescent material.

The reflective sheet 1130 may be disposed below the light guide member 1120. The reflective sheet 1130 may reflect light, which is emitted through the bottom surface of the light guide member 1120, toward the outgoing surface of the light guide member 1120.

The reflective sheet 1130 may be formed of a resin material having high reflectivity such as polyethylene terephthalate (PET), polycarbonate (PC), and polyvinyl chloride (PVC), but is not limited thereto.

Figure 20:
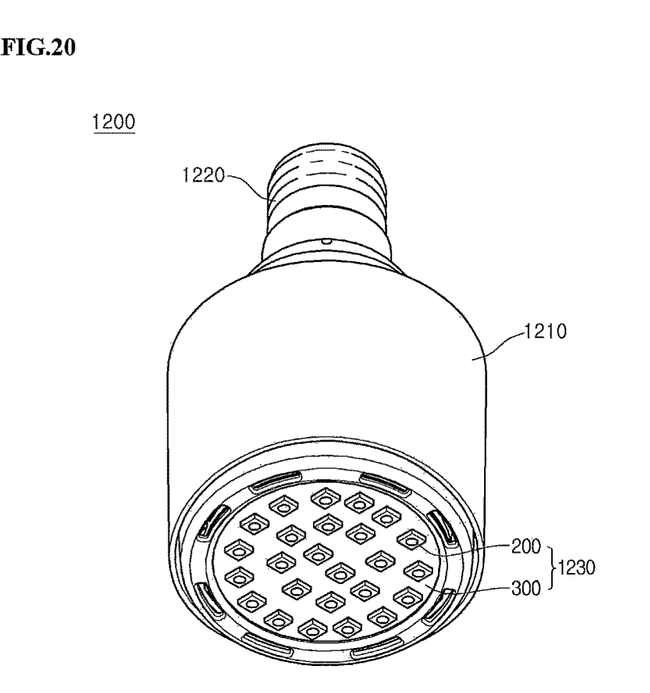
FIG. 20 is a perspective view of a lighting unit including a light emitting device according to embodiments.

FIG. 20 is a perspective view of a lighting unit 1200 including a light emitting device 100 or a light emitting device package 200 according to embodiments. However, the lighting unit 1200 of FIG. 20 is just one example of a lighting system and thus, is not limited thereto.

Referring to FIG. 20, the lighting unit 1200 includes a case body 1210, a light emitting module 1230 installed at the case body 1210, and a connection terminal 1220 installed at the case body 1210 and receiving power from an external power source.

The case body 1210 may be formed of a material having excellent heat radiating characteristics, for example, a metal material or a resin material.

The light emitting module 1230 may include a substrate 300, and at least one light emitting device 100 or a light emitting device package 200 mounted on the substrate 300 according to embodiments. However, according to this embodiment, the light emitting device package 200 is exemplarily installed on the substrate 300.

A circuit pattern may be printed on an insulator to form the substrate 300. For example, the substrate 300 may include a typical Printed Circuit Board (PCB), a metal core PCB, a flexible PCB, and a ceramic PCB.

Additionally, the substrate 300 may be formed of a material that efficiently reflects light, or colors from which light is efficiently reflected, for example, white color or silver color.

The light emitting device package 200 according to the at least one embodiment may be mounted on the substrate 300. The light emitting device package 200 may include at least one Light Emitting Diode (LED). The LED may include a colored LED emitting each of red, green, blue, or white and an Ultra Violet (UV) LED emitting UV.

The light emitting module 1230 may be disposed with various combinations of light emitting devices to obtain colors and brightness. For example, a white LED, a red LED, and a green LED are combined and disposed to obtain a high Color Rendering Index (CRI). Additionally, a fluorescent sheet may be further disposed on a traveling path of light emitted from the light emitting module 1230. Therefore, the fluorescent sheet changes a wavelength of light emitted from the light emitting module 1230. For example, if light emitted from the light emitting module 1230 has a wavelength range of blue, the fluorescent sheet may include a yellow fluorescent material. Thus, light emitted from the light emitting module 1230 may be finally seen as white light through the fluorescent sheet.

The connection terminal 1220 may be electrically connected to the light emitting module 1230 to supply power. As shown in FIG. 20, the connection terminal 1220 has a socket type and is rotated and inserted into the external power, but is not limited thereto. For example, the connection terminal 1220 may have a pin type and is inserted into the external power, or may be connected to the external power through a wire.

The above lighting system may include at least one of a light guide member, a diffusion sheet, a light condensing sheet, a brightness enhancing sheet, and a fluorescent sheet, on a travelling path of light emitted from the light emitting module, to achieve a desired optical effect.

As described above, the lighting system includes a light emitting device or a light emitting device package with a high light emitting efficiency according to an embodiment, so that excellent optical efficiency can be achieved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a light emitting structure layer comprising a first conductive semiconductor layer, an active layer, and a second conductive semiconductor layer;
   a plurality of oxide protrusions directly contacted with an upper surface of the second conductive semiconductor layer the plurality of oxide protrusions comprising at least one of GaO, InO, InGaO, AlInO, AlGaO, AlO and AlInGaO, the plurality of oxide protrusion include an oxide of at least a portion of the second conductive semiconductor layer; and
   a current spreading layer on the second conductive semiconductor layer and the plurality of oxide protrusions.

2. The light emitting device according to claim 1, wherein each of the oxide protrusions includes an oxide of at least a portion of the second conductive semiconductor layer.

3. The light emitting device according to claim 1, wherein the current spreading layer comprises one of Indium-Tin Oxide (ITO), ZnO, Aluminum doped Zinc Oxide (AZO), Indium Zinc Oxide (IZO), Antimony Tin Oxide (ATO), and Zinc Indium-Tin Oxide (ZITO).

4. The light emitting device according to claim 1, wherein the first conductive semiconductor layer is an n-type semiconductor layer; and
   the second conductive semiconductor layer is a p-type semiconductor layer.

5. The light emitting device according to claim 1, wherein the second conductive semiconductor layer comprises a first semiconductor layer and a second semiconductor layer having respectively different compositions;
   the first semiconductor layer is adjacent to the active layer and the second semiconductor layer is disposed on an opposite side of the active layer; and
   the oxide protrusions are disposed on the second semiconductor layer and include an oxide of at least a portion of the second semiconductor layer.

6. The light emitting device according to claim 1, wherein the second conductive semiconductor layer has at least one of GaN, InN, InGaN, AlInN, AlGaN, AlN, and AlInGaN.

7. The light emitting device according to claim 1, wherein the oxide protrusions have a uniform nano size and are arranged with a predetermined interval.

8. The light emitting device according to claim 1, further comprising a substrate under the light emitting structure.

9. The light emitting device according to claim 8, further comprising an undoped nitride layer between the substrate and the light emitting structure layer.

10. The light emitting device according to claim 8, the substrate has at least one light transmitting material.

11. The light emitting device according to claim 8, wherein the substrate has at least a conductive supporting substrate.

12. A light emitting device comprising:
   a substrate comprising at least one of a light transmitting material;
   a light emitting structure layer comprising a n-type semiconductor layer, an active layer and a p-type semiconductor layer;
   a plurality of oxide protrusions directly contacted with an upper surface of the p-type semiconductor layer the plurality of oxide protrusions comprising at least one of GaO, InO, InGaO, AlInO, AlGaO, AlO and AlInGaO, the plurality of oxide protrusion include an oxide of at least a portion of the p-type conductive semiconductor layer; and a current spreading layer on the p-type semiconductor layer and the oxide protrusions.

13. The light emitting device according to claim 12, wherein each of the oxide protrusions includes an oxide of at least a portion of the p-type semiconductor layer.

14. The light emitting device according to claim 12, wherein the current spreading layer comprises one of Indium-Tin Oxide (ITO), ZnO, Aluminum doped Zinc Oxide (AZO), Indium Zinc Oxide (IZO), Antimony Tin Oxide (ATO), and Zinc Indium-Tin Oxide (ZITO).

15. The light emitting device according to claim 12, wherein the p-type semiconductor layer has at least one of GaN, InN, InGaN, AlInN, AlGaN, AlN, and AlInGaN.

16. The light emitting device according to claim 12, wherein the oxide protrusions have a uniform nano size and are arranged with a predetermined interval.

17. A light emitting device package comprising:
   a body;
   a first electrode layer and a second electrode layer on the body;
   a light emitting device connected electrically to the first electrode layer and the second electrode layer on the body; and
   a molding member surrounding the light emitting device on the body, wherein the light emitting device comprising:
   a light emitting structure layer comprising a first conductive semiconductor layer, an active layer, and a second conductive semiconductor layer;
   a plurality of oxide protrusions directly contacted with an upper surface of the second conductive semiconductor layer the plurality of oxide protrusions comprising at least one of GaO, InO, InGaO, AlInO, AlGaO, AlO and AlInGaO, the plurality of oxide protrusion include an oxide of at least a portion of the second conductive semiconductor layer; and
   a current spreading layer on the second conductive semiconductor layer and the oxide protrusions.

18. The light emitting device according to claim 17, wherein the oxide protrusions have a uniform nano size and are arranged with a predetermined interval.

* * * * *